United States Patent [19]

Arai

[11] Patent Number: 5,030,923
[45] Date of Patent: Jul. 9, 1991

[54] VARIABLE GAIN AMPLIFIER

[75] Inventor: Masashi Arai, Oizumi, Japan

[73] Assignee: Sanyo Electric Co., Ltd., Osaka, Japan

[21] Appl. No.: 437,570

[22] Filed: Nov. 17, 1989

[30] Foreign Application Priority Data

Nov. 18, 1988 [JP] Japan .................. 63-292858

[51] Int. Cl.⁵ .................. H03F 3/45; H03G 3/30
[52] U.S. Cl. .................. 330/254; 330/279
[58] Field of Search .......... 330/252, 254, 257, 261, 330/278, 279, 285, 310

[56] References Cited

U.S. PATENT DOCUMENTS 4,101,841 7/1978 Okada et al. .................. 330/254
4,134,078 1/1979 Arai et al. .................. 330/254

OTHER PUBLICATIONS

"Development of Radio Data System Decoder IC's", Ogawa et al., IEEE Transactions on Consumer Electronics, vol. CE-33, No. 3, Aug., 1987, pp. 383-394.
"Integrated Linear Basic Circuits", van Kessel et al., Philips Technical Review, vol. 32, 1971, No. 1, pp. 1-12 and 32.

Primary Examiner—Steven Mottola
Attorney, Agent, or Firm—Armstrong, Nikaido, Marmelstein, Kubovcik & Murray

[57] ABSTRACT

A variable gain amplifier includes a first stage amplifying portion and a subsequent stage amplifying portion for amplifying an output from the first stage amplifying portion and outputting an amplified signal to an output terminal. The first stage amplifying portion includes first and second transistors having emitters connected to each other through a resistor based upon which an input dynamic range is determined, and first and second diodes which are connected to collectors of the transistors as loads thereof. A reference current is generated by a reference current generating portion. A control current generating portion generates a control current which is N times the reference current and supplied to the collectors of the first and second transistors. Currents flowing through the first and second diodes is sunk by a current sinking portion. Values of the above reference current and a sunk current by the current sinking portion is controlled by a control portion in accordance with a level of a control signal, whereby a total gain of the variable amplifier can be varied.

5 Claims, 2 Drawing Sheets

VARIABLE GAIN AMPLIFIER

BACKGROUND OF THE INVENTION

1. Field of the invention

The present invention relates generally to a variable gain amplifiers, and more particularly, to a variable gain amplifier capable of ensuring a wide gain-controllable range.

2. Description of the prior art

A circuit diagram showing an RDS signal decoder IC is described in an article "Development of Radio Data System Decoder IC's" in page 383-394 of IEEE Transactions on CONSUMER ELECTRONICS, Vol. CE-33, No. 3 issued on Aug. 26, 1987. A variable gain amplifier for making the level of an RDS signal constant is arranged in the RDS signal decoder IC. The above described variable gain amplifier has such a structure as shown in FIG. 3.

In FIG. 3, an input signal Vi to be subjected to gain-control is applied to an input terminal 1 and is then amplified in a first stage amplifying portion 4 including first and second transistors 2 and 3. At that time, a gain-controlling signal Vc is applied to a control input terminal 5 of the first stage amplifying portion 4. Accordingly, a gain of the first stage amplifying portion 4 becomes to be corresponding to the gain-controlling signal Vc. An output signal $V_{01}$ of the first stage amplifying portion 4 is taken-out from collectors of the first and second transistors 2 and 3 which are double-ended, being applied to a subsequent stage amplifying portion 6. The output signal $V_{01}$ is further amplified in the subsequent stage portion 6 and then, provided to an output terminal 7.

On the assumption that $R_E$ is a resistance value of a resistor 8 connected between emitters of the first and second transistors 2 and 3 and $I_l$ is a collector current of each of constant-current transistors 9 and 10, the gain $G_l$ of the first stage amplifying portion 4 is as follows:

$$G_1 = \frac{V_{01}}{Vi} = \frac{2 \cdot \frac{1}{I_1} \cdot \frac{KT}{q}}{R_E + 2 \cdot \frac{1}{I_1} \cdot \frac{KT}{q}} \quad (1)$$

where K is the Boltzmann constant, T is the absolute temperature, and q is the charge on electrons.

Furthermore, let $2I_2$ be a current flowing through a constant-current source 11 in the subsequent stage amplifying portion 6 and let $R_L$ be a resistance value of a load resistor 12, a gain $G_2$ of the subsequent stage amplifying portion 6 is as follows:

$$G_2 = \frac{V_0}{V_{01}} = \frac{R_L}{\frac{1}{I_2} \cdot \frac{KT}{q}} \quad (2)$$

where $V_O$ is an output voltage obtained at the output terminal 7.

From the above described equations 1 and 2, a total gain G of the circuit shown in FIG. 3 is as follows:

$$G = G_1 \cdot G_2 = \frac{I_2}{I_1} \cdot \frac{2R_L}{R_E + \frac{2}{I_1} \cdot \frac{KT}{q}} \quad (3)$$

Here $R_E >> 2KT/qI_l$ because $2KT/qI_l$ is an internal resistance of the emitter of the transistor. Accordingly, the total gain G is approximately proportional to $I_2/I_l$. Consequently, if the control signal Vc applied to the control input terminal 5 is varied, the current Il is changed in response thereto, so that the total gain G is changed. Therefore, the circuit shown in FIG. 3 can be used as a variable gain amplifier.

As obvious from the above described equations 3, a maximum gain of the variable gain amplifier shown in FIG. 3 is determined by the resistance value $R_E$ of the resistor 8. The smaller the above resistance value $R_E$ is, the larger the maximum gain can be.

In addition, an input dynamic range of the above described variable gain amplifier shown in FIG. 3 is determined by a product of the resistance value $R_E$ of the resistor 8 and the current $I_l$ flowing through the constant-current transistors 9 and 10, i.e., $R_E \cdot I_l$. The larger the above resistance value RE is, the larger the input dynamic range can be.

Furthermore, a gain-controllable range of the variable gain amplifier shown in FIG. 3 is determined by an inherent maximum current value being dependent on resistance components of diodes 13 and 14, saturation of the first and second transistors 2 and 3 and etc.

Therefore, the resistor 8 is associated with all characteristics such as a maximum gain, an input dynamic range, and an gain-controllable range. On the other hand, a direction of a change in value of the resistor 8 and a direction of improvements in the above characteristics do not necessarily coincide with each other. Accordingly, it is very difficult to select a resistance value at which the above characteristics are all the best.

SUMMARY OF THE INVENTION

Therefore, a principal object of the present invention is to provide a novel variable gain amplifier.

Another object of the present invention is to provide a variable gain amplifier having a wider range wherein a gain can be controlled or varied.

The other object of the present invention is to provide a variable gain amplifier capable of being easily designed.

A variable gain amplifier in accordance with the present invention comprises a first stage amplifying portion including a pair of transistors and diodes arranged as loads of the pair of transistors; a subsequent stage amplifying portion for amplifying an output signal of the first stage amplifying portion; a reference current generating portion for generating a reference current; a control current generating portion for generating a control current which is N times the reference current to supply the same to collectors of the pair of transistors; a current sinking portion for sinking currents flowing through the diodes; and a control portion for controlling values of the reference current and a sunk current in response to a level of a gain-controlling signal.

A maximum current is supplied to the collectors of the pair of transistors from the control current generating portion while a level of an input signal is small. Consequently, a gain of a first stage amplifying portion becomes maximum. As the level of the input signal becomes larger, the control current of the control current generating portion is decreased, so that the gain of the first stage amplifying portion is decreased. At that time, the current sinking portion has not started to operate yet. When the level of the input signal further becomes larger, the reference current of the reference current generating portion becomes zero and then, the current sinking portion starts to operate. Accordingly, currents flowing through diodes serving as loads are increased, so that the gain of the first stage amplifying portion is further decreased.

In accordance with the present invention, since the gain-control is exercised by means of combination of first gain control using the reference current generating portion and the control current generating portion and second gain control using the current sinking portion, the gain-controllable range can be enlarged. In addition, since the maximum gain can be set by the reference current generating portion and the input dynamic range can be set by a resistor connected between the emitters of the pair of transistors in the first stage amplifying portion, it is possible to provide a variable gain amplifier which can be easily designed.

The objects and other objects, features, aspects and advantages of the present invention will become more apparent from the following detailed description of the embodiments of the present invention when taken in conjunction with accompanying drawings.

DETAIL DESCRIPTION OF THE PREFERRED EMBODIMENTS

Figure 1:
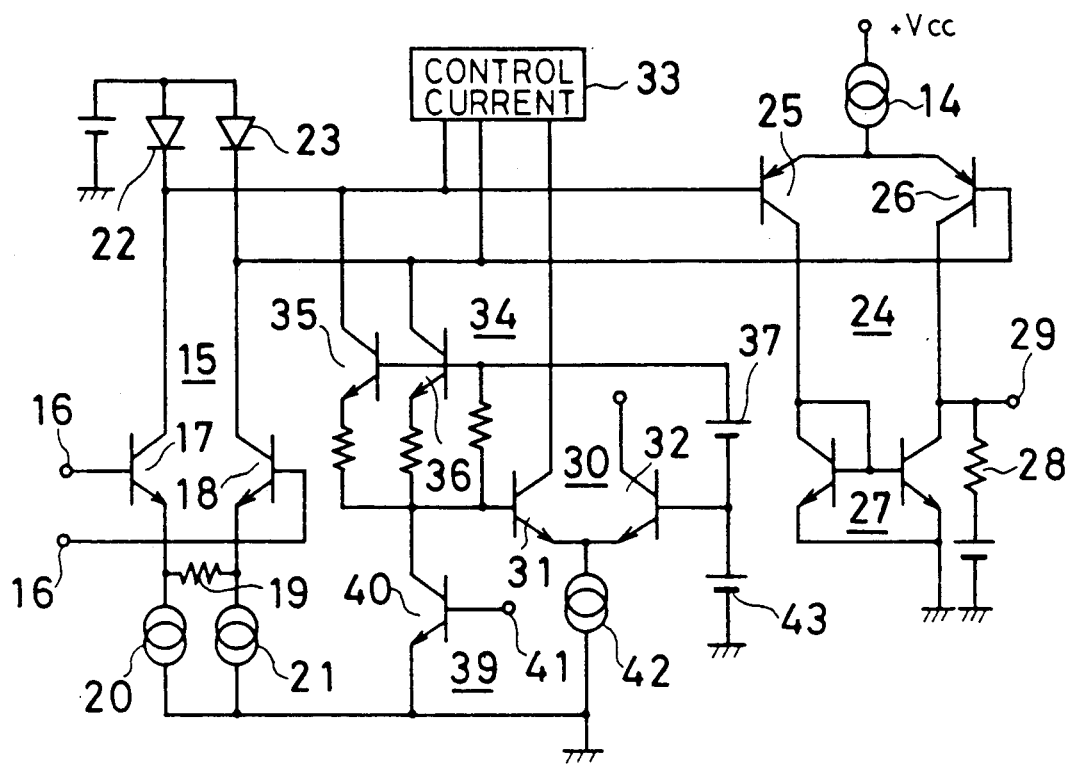
FIG. 1 is a circuit diagram showing a variable gain amplifier in accordance with an embodiment of the present invention.

FIG. 1 is a circuit diagram showing a variable gain amplifier in accordance with an embodiment of the present invention. A first stage amplifying portion 15 includes an input terminal 16 to which an input signal to be controlled is applied, first and second transistors 17 and 18, a resistor 19 connected between emitters of the first and second transistors 17 and 18 to set an input dynamic range, first and second constant-current circuits 20 and 21 constituting emitter current paths of the above first and second transistors 17 and 18, and first and second diodes 22 and 23 connected to collectors of the first and second transistors 17 and 18. The first and second diodes 22 and 23 serve as loads for the first and second transistors 17 and 18, respectively.

A subsequent stage amplifying portion 24 includes third and fourth transistors 25 and 26 differentially connected to each other and a current mirror circuit 27 arranged as a collector load of the third and fourth transistors 25 and 26. A load resistor 28 is connected to an output terminal 29 connected to a collector of the above fourth transistor 26.

A reference current generating portion 30 includes fifth and sixth transistors 31 and 32 differentially connected to each other to generate a reference current.

In addition, there is provided in the circuit a control current generating portion 33 having a current mirror circuit configuration for generating a current which is N times (N<1) the above reference current.

Figure 2:
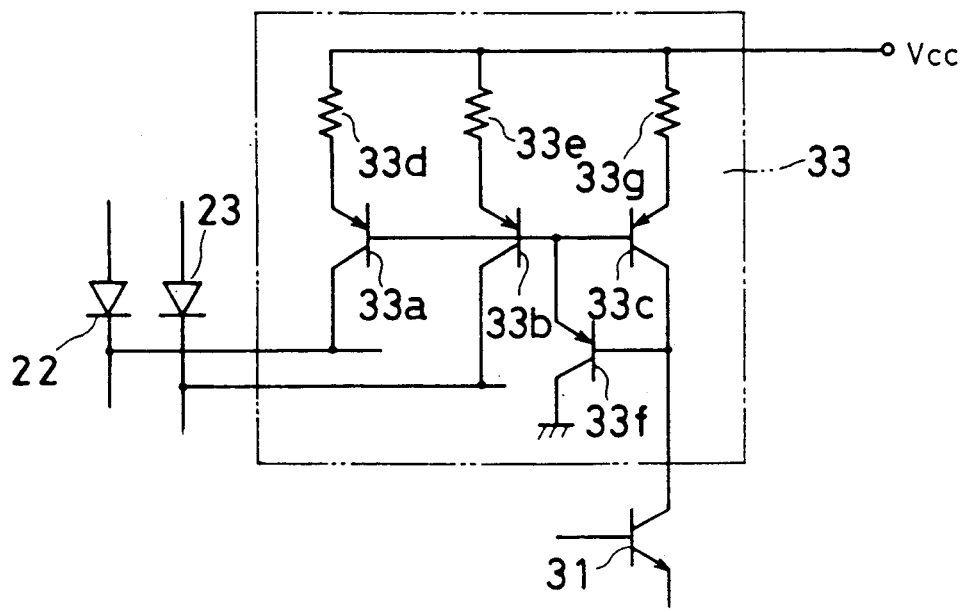
FIG. 2 is a circuit diagram showing one example of a control current generating portion in FIG. 1 embodiment.
Figure 3:
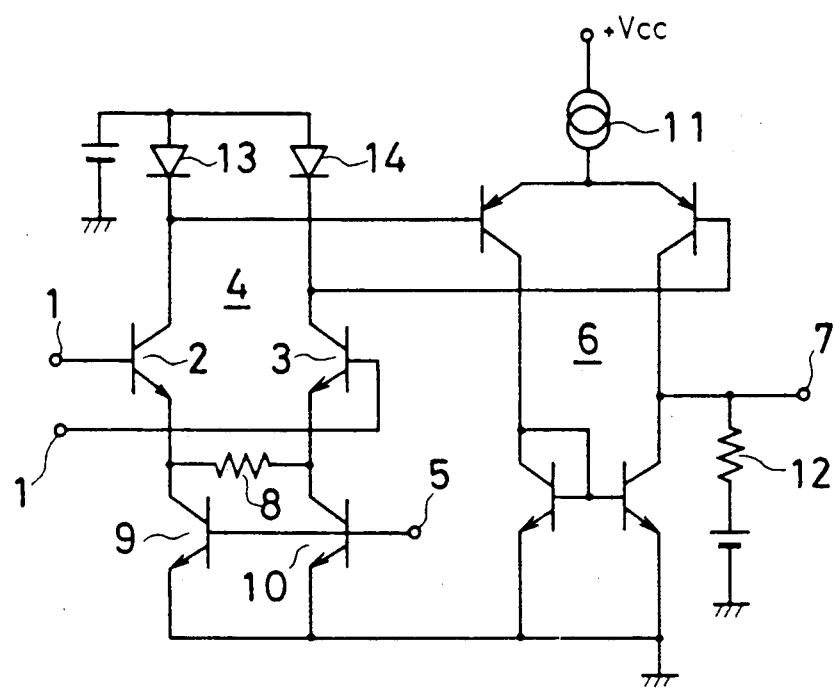
FIG. 3 is a circuit diagram showing a conventional variable gain amplifier.

As shown in FIG. 2, the control current generating portion 33 includes three transistors 33a, 33b and 33c connected in parallel with each other. Collectors of the transistors 33a and 33b are connected to the collectors of the first and second transistors 17 and 18 and thus cathodes of the first and second diodes 22 and 23. Emitters of the transistors 33a and 33b are commonly connected to a voltage source Vcc through resistors 33d and 33e, respectively. A collector of the transistor 33c is connected to the collector of the transistor 31 and a base of the transistor 33f which is connected between the bases of three transistors 33a-33c and the ground. An emitter of the transistor 33c is connected to the above voltage source Vcc through a resistor 33g.

In this control current generating portion 33, in accordance with the teachings taught by the article "Integrated linear basic circuits", page 1-12 of Philips Technical Review, Vol. 32, 1971, No. 1, by making each of the emitter resistors 33d and 33i e N times the emitter resistor 33g, an output current becomes N times the collector current of the transistor 31.

A current sinking portion 34 includes seventh and eighth transistors 35 and 36 for sinking currents flowing through the above first and second diodes 22 and 23 and a voltage source 37 for applying an offset voltage to bases of the seventh and eight transistors 35 and 36.

A control portion 39 includes a ninth transistor 40 having its base receiving a gain-controlling signal for controlling the above reference current generating portion 30 and the above current sinking portion 34 by a collector voltage of the ninth transistor 40.

The input signal applied to the input terminal 16 is amplified in the first stage amplifying portion 15 and then, is further amplified in the subsequent stage amplifying portion 24, to generate an amplified output signal at the output terminal 29.

While the input signal is small, a gain-controlling signal Vc for gain-controlling applied to a control terminal 41 becomes small, so that the ninth transistor 40 is turned- off. Consequently, a base voltage of the fifth transistor 31 constituting the reference current generating portion 30 becomes higher than a base voltage of the sixth transistor 32 by a voltage component of the voltage source 37 (approximately 200 mV), so that the fifth transistor 31 is turned-on while the sixth transistor 32 is turned-off. Accordingly, the output current of the reference current generating portion 30 becomes equal in value to a current $I_l$ flowing through a constant-current circuit 42. The above output current is multiplied by N in the control current generating portion 33, being supplied to the collectors of the first and second transistors 17 and 18.

If the above described control current generating portion 33 does not exist, a collector current of the first transistor 17 becomes equal to the current flowing through the first diode 22, and a collector current of the second transistor 18 becomes equal to the current flowing through the second diode 23. Accordingly, the gain of the first stage amplifying portion 15 is determined by the currents flowing through the above first and second diodes 22 and 23. However, since the control current generating portion 33 is provided in FIG. 1 circuit, portions of the collector currents of the first and second transistors 17 and 18 are respectively forced to be supplied from the control current generating portion 33, so that the currents flowing through the first and second diodes 22 and 23 are reduced. Accordingly, the gain of the first stage amplifying portion 15 is increased. While the input signal is small and the gain-controlling signal Vc is small, the ninth transistor 40 is turned-off, so that the collector current of the fifth transistor 31 becomes $I_l$ and the output control current of the control current generating portion 33 becomes $N.I_l$. Accordingly, the gain of the first stage amplifying portion 15 becomes maximum.

When the input signal becomes large and the control signal Vc becomes large, since conductivity of the ninth transistor 40 is increased, the base voltage of the fifth transistor 31 is lowered. Accordingly, a differential amplifier constituting the reference current generating portion 30 becomes to be operated in an active region, and therefore, the collector current of the fifth transistor 31 is decreased from $I_1$ in accordance with the gain-controlling signal Vc. Assuming that the collector current of the fifth transistor 31 is $I_2$ ($=M.I_1$: where M is a split current ratio; $M<1$), the output current of the control current generating portion 33 is decreased to $N.I_2$ ($=N.M.I_1$) and correspondingly, the currents flowing through the first and second diodes 22 and 23 are increased. Therefore, the gain of the first stage amplifying portion 15 is gradually decreased.

When the input signal becomes a predetermined value and thus the gain-controlling signal Vc becomes a predetermined value, the fifth transistor 31 is turned-off while the sixth transistor 32 is turned-on, so that the collector current of the above fifth transistor 31, that is, the output current of the reference current generating portion 30 becomes zero. Accordingly, the output control current of the control current generating portion 33 also becomes zero. Therefore, the collector currents flowing through the first and second transistors 17 and 18 respectively become equal to the currents flowing through the first and second diodes 22 and 23. Accordingly, the gain of the first stage amplifying portion 15 becomes a small predetermined value. The collector voltage of the ninth transistor 40 at that time corresponds to the value of a voltage source 43.

On the assumption that Vi is the input signal voltage, Vo is the output signal voltage obtained at the output terminal 29, $R_E$ is the value of the resistor 19, $2I_3$ is a current flowing through the constant-current circuit 44, and $R_L$ is the value of the load resistor 28, the total gain G of the variable gain amplifier as shown in FIG. 1 is a follows:

$$G = \frac{V_0}{V_i} = \frac{2 \frac{1}{I_1 - NI_2} \cdot \frac{KT}{q}}{R_E + 2 \cdot \frac{1}{I_1} \frac{KT}{q}} \cdot \frac{R_L}{\frac{1}{I_3} \cdot \frac{KT}{q}} \approx \frac{2I_3}{I_1 - NI_2} \cdot \frac{R_L}{R_E} \quad (4)$$

Accordingly, the gain control using the reference current generating portion 30 and the control current generating portion 33 is exercised in accordance with the above described equation 4, its qualitative operation being as described above.

Description is now made on the gain control using the current sinking portion 34. When the input signal further becomes larger and thus the gain-controlling signal Vc further becomes larger, a collector voltage Vx of the ninth transistor 40 is further lowered. When the above collector voltage Vx is lowered to a value represented by the following equation, the above described seventh and eighth transistors 35 and 37 are turned-on, thereby to sink the currents flowing through the first and second diodes 22 and 23:

$$V_x = V_1 + V_2 - V_{BE} \quad (5)$$

where $V_1$ is a voltage of the voltage source 37, $V_2$ is a voltage of the voltage source 43, VBE is a base-emitter voltage of each of the seventh and eighth transistors 35 and 36.

Therefore, the output currents of the first and second diodes 22 and 23 respectively become equal to a summed current of the collector currents of the first and second transistors 17 and 18 and the collector currents of the seventh and eighth transistors 35 and 36. Accordingly, the gain of the first stage amplifying portion 15 is further decreased.

The gain control operations are summarized as follows. More specifically, the gain of the first stage amplifying portion 15 is a value corresponding to a control current determined by a reference current $I_2$ equal to the current $I_1$ flowing through the constant-current circuit 42 and the current ratio N of the control current generating portion 33 while the input signal is small. The gain is decreased if the above reference current $I_2$ is decreased to $M I_1$ with the increase in the input signal. A non-controlled state occurs where the gain is determined by currents flowing through the constant-current circuits 20 and 21 if the above reference current $I_2$ becomes zero. The gain is further decreased depending on a sunk current of the current sinking portion 34 if the input signal is further increased.

Therefore, the use of the variable gain amplifier as shown in FIG. 1 can significantly enlarge the gain controllable range. In addition, the maximum gain is determined by the maximum control current of the control current generating portion 33, that is, the current $I_1$ flowing through the constant-current circuit 42 in the reference current generating portion 30 and the current ratio N and can be arbitrarily set.

Furthermore, the input dynamic range of the variable gain amplifier shown in FIG. 1 is determined by the currents flowing through the constant-current circuits 20 and 21 and the resistor 19. Unlike the conventional variable gain amplifier, however, the value of the above described resistor 19 need not be considered with reference to setting of the gain control range and the maximum gain. Consequently, the input dynamic range can be set to such a value that it is enlarged, that is, a relatively large value.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable gain amplifier comprising:
   a first stage amplifying portion including a pair of transistors and diodes being arranged as loads of said pair of transistors;
   a subsequent stage amplifying portion for amplifying an output signal of said first stage amplifying portion;
   a reference current generating portion for generating a reference current;
   a control current generating portion for generating a control current which is N times said reference current, where $N<1$, and supplying said control current to collectors of said pair of transistors;
   a current sinking portion for sinking currents flowing through said diodes; and
   a control portion for controlling values of the reference current of said reference current generating portion and a sunk current of said current sinking portion in accordance with a level of a gain-controlling signal.

2. A variable gain amplifier in accordance with claim 1, wherein the value of said reference current is changed depending on the value of said gain-controlling signal when the level of said gain-controlling signal is in a first predetermined range, while the value of said sunk current is changed depending on the value of said gain-controlling signal when the level of said gain-controlling signal is in a second predetermined range which is larger than said first predetermined range.

3. A variable gain amplifier in accordance with claim 1, wherein said control current generating portion supplies the control current to the collectors of said pair of transistors, thereby decreasing the currents flowing through said diodes to increase a gain of said first stage amplifying portion.

4. A variable gain amplifier in accordance with claim 1, wherein said current sinking portion sinks the currents flowing through said diodes, thereby increasing the currents flowing through said diodes to decrease a gain of said first stage amplifying portion.

5. A variable gain amplifier in accordance with claim 1, wherein said pair of transistors have their emitters connected to each other through a resistor.

* * * * *